US012615749B2

(12) United States Patent
Ding et al.

(10) Patent No.: US 12,615,749 B2
(45) Date of Patent: Apr. 28, 2026

(54) ON BOARD POWER DEVICE AND THERMAL MANAGEMENT SYSTEM

(71) Applicant: Delta Electronics (Shanghai) Co.,Ltd., Shanghai (CN)

(72) Inventors: Hongguang Ding, Shanghai (CN); Peiai You, Shanghai (CN); Yueyong Meng, Shanghai (CN); Jinfa Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 311 days.

(21) Appl. No.: 18/356,253

(22) Filed: Jul. 21, 2023

(65) Prior Publication Data

US 2024/0049436 A1     Feb. 8, 2024

(30) Foreign Application Priority Data

Aug. 3, 2022    (CN) .......................... 202210926095.4

(51) Int. Cl.
| | |
|---|---|
| *H01H 37/76* | (2006.01) |
| *H01F 27/02* | (2006.01) |
| *H01F 27/10* | (2006.01) |
| *H01H 69/02* | (2006.01) |
| *H05K 7/20* | (2006.01) |
| *H05K 9/00* | (2006.01) |

(52) U.S. Cl.
CPC ....... *H05K 7/20927* (2013.01); *H01F 27/022* (2013.01); *H01F 27/10* (2013.01); *H05K 7/20236* (2013.01); *H05K 9/0081* (2013.01)

(58) Field of Classification Search
CPC .......... H05K 7/20272; H05K 7/20236; H05K 7/20772; H05K 7/20927; H05K 9/0081; H01F 27/022; H01F 27/10
USPC ........................................................ 361/699
See application file for complete search history.

(56) References Cited

U.S. PATENT DOCUMENTS

| | | | | |
|---|---|---|---|---|
| 6,828,675 B2 * | 12/2004 | Memory | ............... | F28D 7/0025 |
| | | | | 257/714 |
| 6,999,316 B2 * | 2/2006 | Hamman | ................ | G06F 1/203 |
| | | | | 165/104.31 |

(Continued)

FOREIGN PATENT DOCUMENTS

| | | |
|---|---|---|
| CN | 208046467 U | 11/2018 |
| CN | 109756056 A | 5/2019 |

(Continued)

*Primary Examiner* — Anatoly Vortman
(74) *Attorney, Agent, or Firm* — CKC & Partners Co., LLC

(57)     ABSTRACT

The present disclosure discloses an onboard power device and a thermal management system, wherein the thermal management system comprises the onboard power device which comprises a power assembly comprising a plurality of electronic components and a shell comprising an inner cavity and a coolant passage that are isolated from each other, wherein the power assembly is disposed in the inner cavity which is filled with insulating heat conductive fluid, the power assembly being immersed in the insulating heat conductive fluid, and wherein a coolant flows through the coolant passage. The present disclosure allows the power assembly to be sufficiently and uniformly cooled by immersing in insulating heat conductive fluid, and by circulating coolant in the coolant passage of the onboard power device.

20 Claims, 16 Drawing Sheets

(56) References Cited

U.S. PATENT DOCUMENTS

| | | | | |
|---|---|---|---|---|
| 7,318,322 B2* | 1/2008 | Ota | H05K 7/20781 | |
| | | | 62/305 | |
| 7,508,665 B1* | 3/2009 | Palmer | H05K 7/2079 | |
| | | | 361/696 | |
| 7,808,780 B2* | 10/2010 | Brunschwiler | H05K 7/20772 | |
| | | | 165/185 | |
| 7,826,216 B2* | 11/2010 | Moss | H05K 7/20736 | |
| | | | 361/679.48 | |
| 7,969,727 B2* | 6/2011 | Tozer | H05K 7/20818 | |
| | | | 361/679.48 | |
| 8,059,405 B2* | 11/2011 | Campbell | F28F 3/02 | |
| | | | 361/679.53 | |
| 8,164,897 B2* | 4/2012 | Graybill | H05K 7/20745 | |
| | | | 361/679.48 | |
| 9,049,800 B2* | 6/2015 | Shelnutt | H05K 7/20318 | |
| 10,070,560 B2* | 9/2018 | Campbell | H05K 7/20809 | |
| 10,162,396 B2* | 12/2018 | Cui | H05K 7/20772 | |
| 10,225,957 B2* | 3/2019 | Gao | H05K 7/20772 | |
| 10,483,840 B2* | 11/2019 | You | H05K 7/20327 | |
| 10,925,180 B2* | 2/2021 | Gao | H05K 7/20272 | |
| 11,019,752 B2* | 5/2021 | Gao | H05K 7/20781 | |
| 11,252,847 B2* | 2/2022 | Waddell | H01L 23/427 | |
| 2008/0066889 A1* | 3/2008 | Knight | H05K 7/20345 | |
| | | | 165/104.21 | |

| | | | |
|---|---|---|---|
| 2012/0167597 A1* | 7/2012 | Wilder | F25D 31/002 |
| | | | 165/157 |
| 2020/0288601 A1* | 9/2020 | Gao | H05K 7/20272 |
| 2020/0404812 A1* | 12/2020 | Gao | H05K 7/20272 |
| 2020/0404813 A1* | 12/2020 | Gao | H05K 7/20745 |
| 2021/0360821 A1* | 11/2021 | Gao | H05K 7/1497 |
| 2023/0018736 A1* | 1/2023 | Tsai | H05K 7/20254 |
| 2024/0049436 A1* | 2/2024 | Ding | H05K 9/0081 |
| 2024/0074103 A1* | 2/2024 | Hnayno | H05K 7/20781 |
| 2024/0196563 A1* | 6/2024 | Jia | H05K 7/20263 |
| 2024/0334648 A1* | 10/2024 | Bauduin | H05K 7/2079 |
| 2025/0212370 A1* | 6/2025 | Bauduin | H05K 7/20263 |

FOREIGN PATENT DOCUMENTS

| | | | | |
|---|---|---|---|---|
| CN | 110290673 A | 9/2019 | | |
| CN | 110621133 A | 12/2019 | | |
| CN | 210652719 U | 6/2020 | | |
| CN | 210941374 U | 7/2020 | | |
| CN | 111959252 A | 11/2020 | | |
| CN | 112289761 A | 1/2021 | | |
| CN | 112366924 A | 2/2021 | | |
| CN | 213585212 U | 6/2021 | | |
| CN | 114030368 A | 2/2022 | | |
| CN | 215819181 U | 2/2022 | | |
| CN | 215934614 U | 3/2022 | | |
| CN | 114449795 A | 5/2022 | | |
| WO | WO-2023025093 A1* | 3/2023 | | H05K 7/20254 |

* cited by examiner

100

ON BOARD POWER DEVICE AND THERMAL MANAGEMENT SYSTEM

CROSS REFERENCE TO RELATED APPLICATION

This application claims the benefit of priority to Chinese Application No. 202210926095.4, filed on Aug. 3, 2022, the content of which is incorporated herein by reference in its entirety.

BACKGROUND OF THE DISCLOSURE

1. Field of the Disclosure

The present disclosure relates to thermal management technology, in particular to an onboard power device and a thermal management system.

2. Related Art

At present, electric vehicles have entered a stage of rapid development. However, the mileage and charging time of electric vehicles are directly related to the user experience and have become important considerations when the user selects electric vehicles. Therefore, it is necessary to continuously improve the mileage and shorten the charging time of electric vehicles, and the onboard power conversion system is also developing toward higher switching frequency and power density. This requires a more efficient thermal management system to solve the heat dissipation problem to ensure its normal operation.

In the existing liquid-cooled onboard power conversion system, the power switch inside the system transfers heat to the waterway surface through copper inlay, via holes and thermal interface materials, and then takes away heat through convective heat transfer of the coolant to realize the cooling of the onboard power conversion system. However, the thermal resistance of this indirect liquid cooling mode is large, and it will not be able to meet the heat dissipation requirements with the continuous improvement of the power density of the onboard power conversion system.

In addition, in the prior art, magnetic elements such as transformers/inductors are generally cooled by local glue filling or local dispensing, and the unfilled or dispensed parts are far away from the cold plate. Therefore, the local air natural cooling of magnetic elements such as transformer/inductor is not conducive to the further improvement of the power density of the whole machine.

Therefore, how to provide a heat dissipation method that can meet higher power density has become one of the urgent problems in the industry.

SUMMARY OF THE DISCLOSURE

The purpose of the present disclosure is to provide an onboard power device and a thermal management system, which can effectively solve at least one defect of the prior art.

In order to achieve the above purpose, the present disclosure provides an onboard power device which includes a power assembly including a plurality of electronic components; and a shell including an inner cavity and a coolant passage that are isolated from each other, wherein the power assembly is disposed in the inner cavity which is filled with insulating heat conductive fluid, the power assembly is immersed in the insulating heat conductive fluid, and a coolant flows through the coolant passage.

In order to achieve the above purpose, the present disclosure further provides at least a thermal management system including at least one onboard power device as described above; the inner cavity of each of the onboard power devices is communicated with each other to form a first cooling loop, and the insulating heat conductive fluid flows through the first cooling loop via a driving of a first pump; and/or, the coolant passage of each of the onboard power device is communicated with each other to form a second cooling loop, and the coolant flows through the second cooling loop via a driving of a second pump.

In order to achieve the above purpose, the present disclosure provides thermal management system, comprising: a plurality of onboard power devices, each of which comprises a power assembly comprising a plurality of electronic components, and a shell comprising an inner cavity, wherein the power assembly is disposed in the inner cavity which is filled with insulating heat conductive fluid, and the power assembly is immersed in the insulating heat conductive fluid; wherein a power assembly of each of the onboard power devices comprises one of a battery module, an inverter module, an onboard charger module, and a DCDC power conversion module, or a combination thereof, and the inner cavity of each of the onboard power devices is communicated with each other to form a first cooling loop, and the insulating heat conductive fluid flows through the first cooling loop via a driving of a first pump.

The present disclosure allows the power assembly to be sufficiently and uniformly cooled by immersing in insulating heat conductive fluid, and by circulating coolant in the coolant passage of the onboard power device. In addition, the insulation clearance and creepage on the PCB in the power module can be appropriately reduced due to the strong insulation ability of the insulating heat conductive fluid.

The present disclosure can observe the liquid level of the insulating heat conductive fluid in the inner cavity by providing a liquid injection hole on the shell, which can facilitate liquid replenishment and drainage. The present disclosure is also used to regulate the thermal expansion and contraction of the insulating heat conductive fluid due to temperature changes by providing an expandable air cushion.

In the embodiment of the present disclosure, the onboard power device is cooled by the combination of "immersion heat dissipation" of the power assembly immersed in the insulating heat conductive fluid and "liquid cooling heat dissipation" of the coolant flowing through the coolant passage. During the operation, the insulating heat conductive fluid has no phase change, and the power assembly immersed therein can be directly contacted and cooled by the natural convection of the insulating heat conductive fluid. At the same time, the power assemblies are indirectly cooled by the coolant passage formed on the channel cover plate, for example, so that the heat dissipation effect can be further improved. The overall power density can also be further improved and enhanced for thermal management systems with onboard power device of the present disclosure, for example, an onboard electrical energy conversion system.

Additional aspects and advantages of the present disclosure will be set forth in part in the following description, and will become apparent in part from the description, or may be learned through the practice of the present disclosure.

BRIEF DESCRIPTION OF THE DRAWINGS

The above and other features and advantages of the present disclosure will become more apparent by describing the exemplary embodiments thereof in detail with reference to the drawings.

DETAILED EMBODIMENTS OF THE DISCLOSURE

Figure 1:
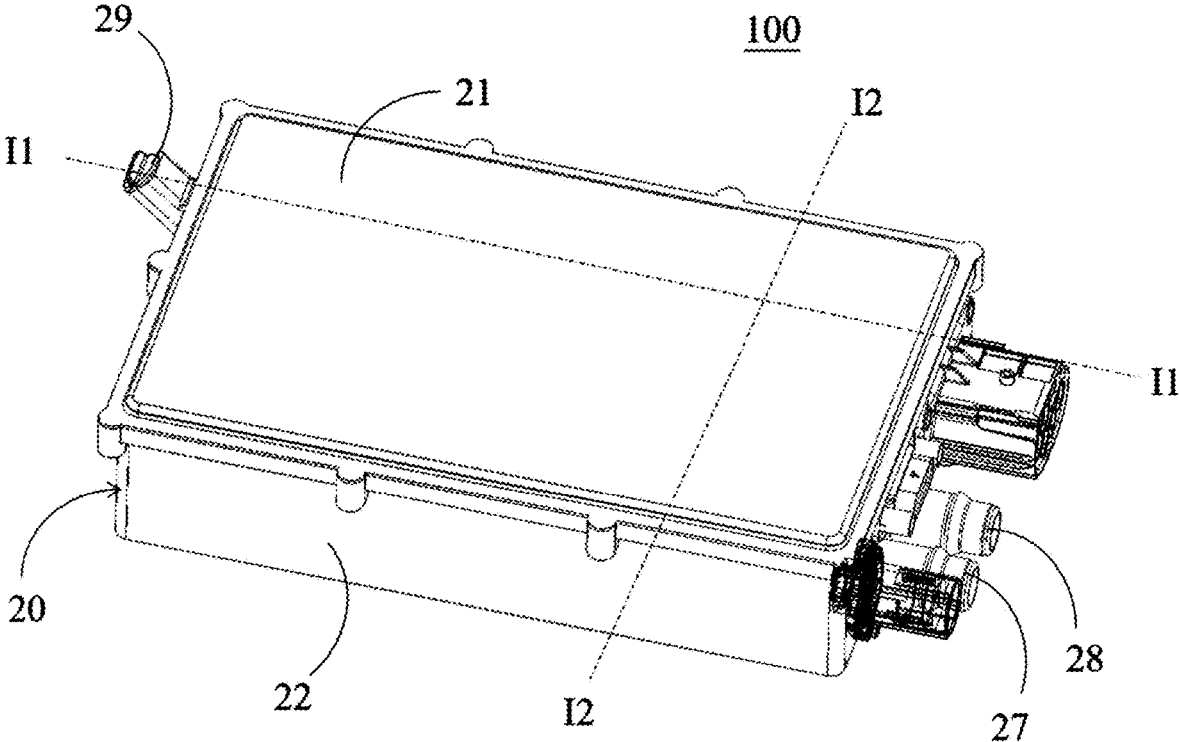
FIG. 1 is a schematic diagram of the three-dimensional structure of the onboard power device of the present disclosure.

Exemplary embodiments will now be described more fully with reference to the accompanying drawing. However, the exemplary embodiments may be implemented in many forms and should not be construed as limited to the embodiments set forth herein. On the contrary, these exemplary embodiments are provided so that the present disclosure will be comprehensive and complete, and will the conception of exemplary embodiments will be fully conveyed to those skilled in the art. The same reference numerals in the drawings denote the same or similar structures, and thus detailed descriptions thereof will be omitted.

When introducing the elements/components/etc. described and/or illustrated herein, the terms "one", "a", "this", "the" and "at least one" are used to indicate the existence of one or more elements/components/etc. The terms "contain", "include" and "have" are used to mean open inclusion and mean that there may be other elements/components/etc. in addition to the listed elements/components/etc. In addition, the terms "first", "second" and the like in the claims are only used as marks, and are not numerical restrictions on their objects.

Figure 2:
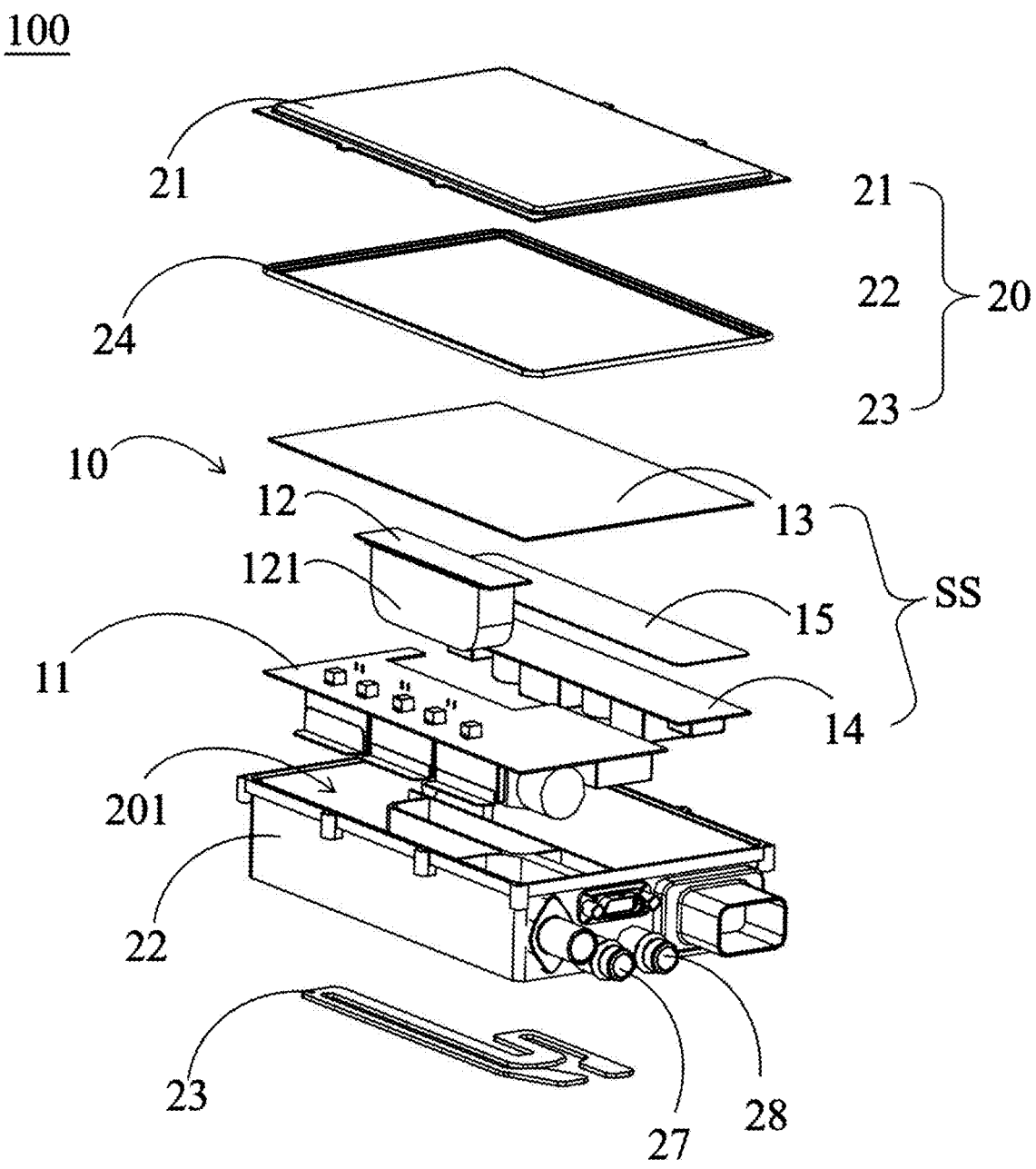
FIG. 2 is a schematic diagram of the breakdown structure of the onboard power device of FIG. 1.
Figure 3:
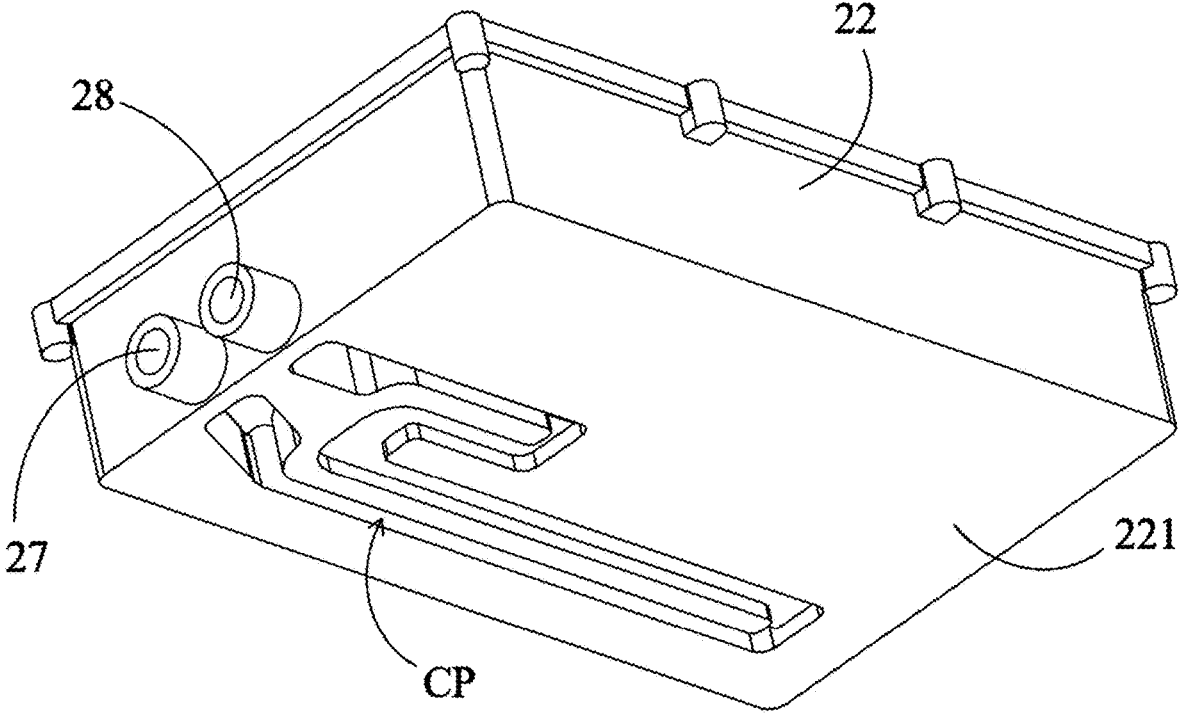
FIG. 3 is a schematic diagram of the structure of the housing of FIG. 2 from the bottom.
Figure 4:
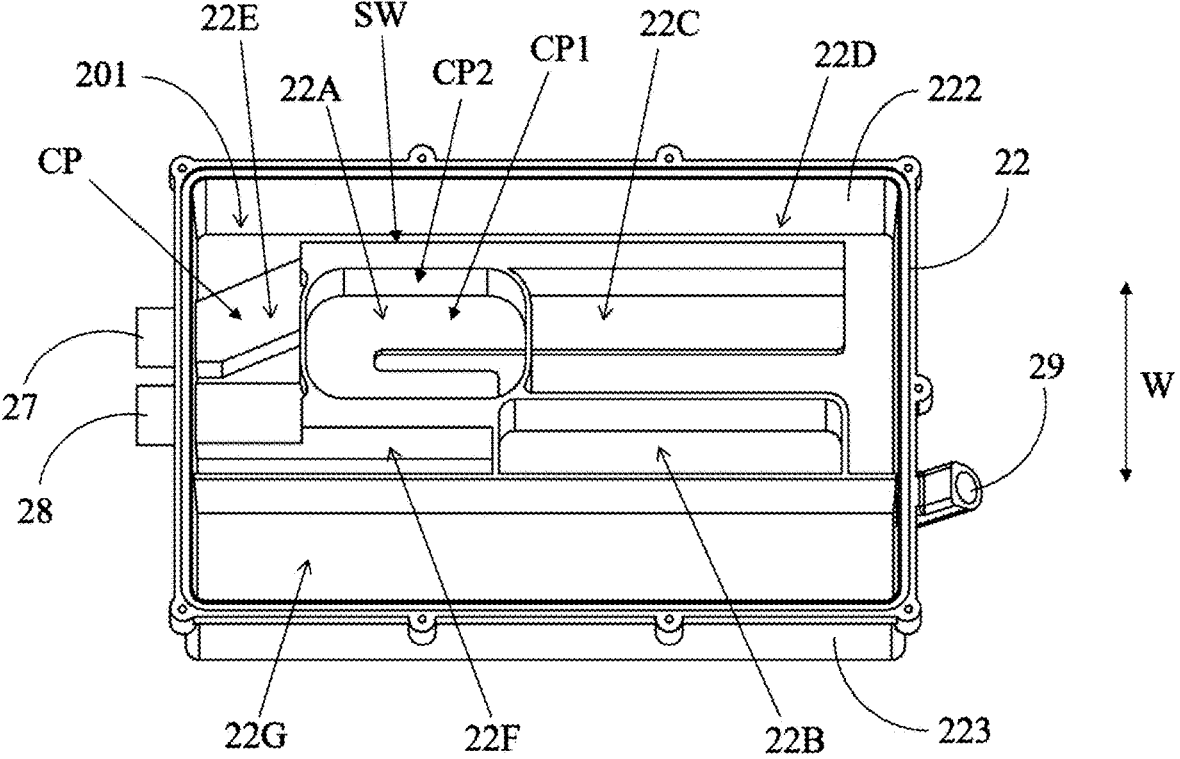
FIG. 4 is a schematic diagram of the structure of the housing of FIG. 2 from the top.
Figure 5:
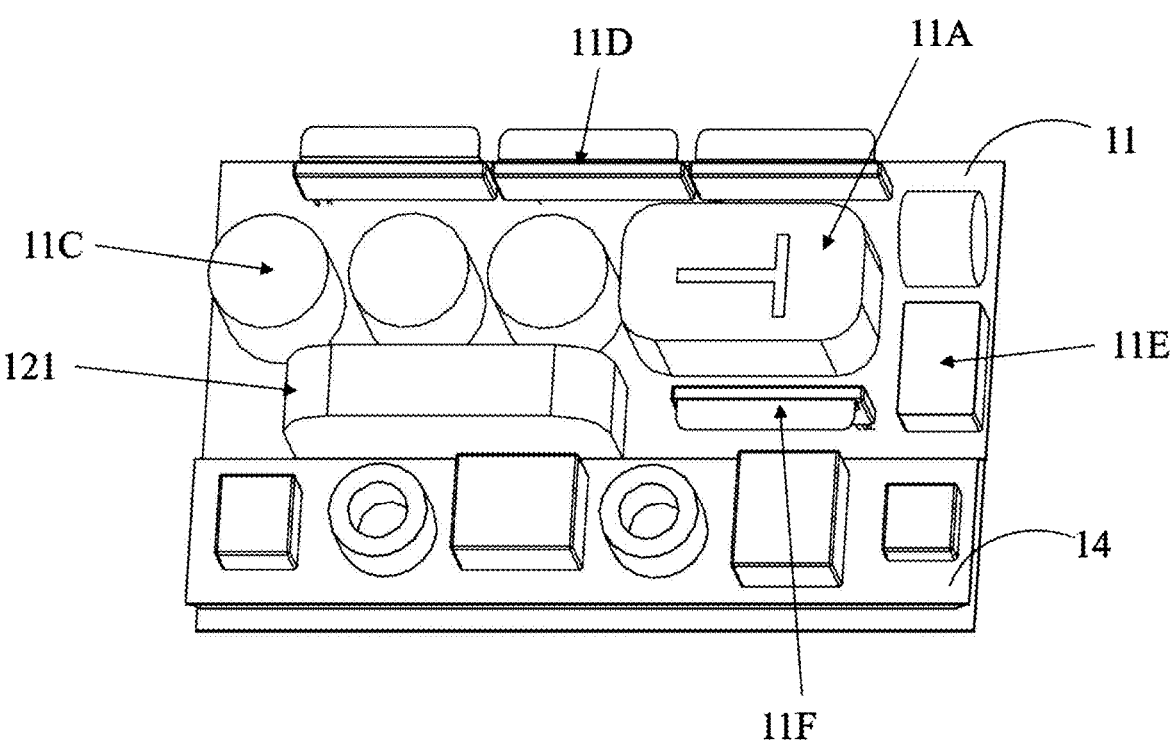
FIG. 5 is a schematic diagram of the structure of the power assembly in FIG. 2 after assembly.
Figure 6:
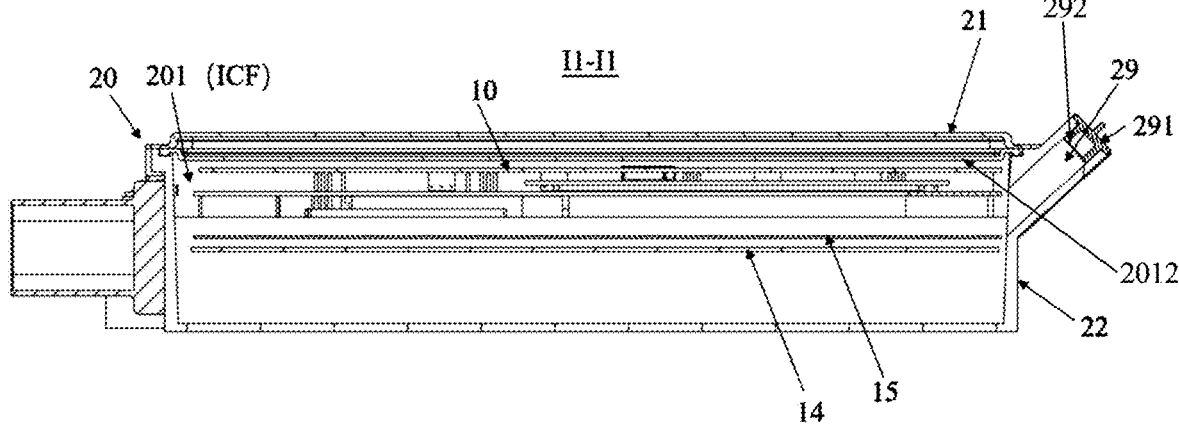
FIG. 6 is a schematic diagram of the section structure of the onboard power device of FIG. 1 along section line I1-I1.

As shown in FIG. 1 to FIG. 7, the present disclosure provides an onboard power device 100, which may include a power assembly 10 and a shell 20. The power assembly 10 includes a plurality of electronic components, for example, including but not limited to major components such as transformer, inductor, capacitor, power switch, and other related components. As shown in FIG. 2 to FIG. 4, the shell 20 includes an inner cavity 201 and a coolant passage (CP) that are isolated from each other. The power assembly 10 is disposed inside the inner cavity 201, which is filled with insulating heat conductive fluid (ICF) (for example, as shown in FIG. 6), and the power assembly 10 is immersed in the insulating heat conductive fluid (ICF). The coolant flows through the coolant passage (CP).

In the present disclosure, the insulating heat conductive fluid (ICF) may be, for example, an oil or a fluorinated liquid, and the coolant may be, for example, a glycol solution, but it will be understood that other heat conductive fluids or coolants that can achieve the same purpose and effect are also feasible, and these do not serve as limitations to the present disclosure. In one embodiment, the insulating heat conductive fluid (ICF) may, for example, fill the inner cavity 201, and the power module 10 may be completely immersed in the insulating heat conductive fluid (ICF).

In the present disclosure, the power assembly 10 may include one of an onboard charger (OBC) module, a battery module, an inverter module, and a DCDC power conversion module or a combination thereof. It will be understood that the power assembly 10 may also be other power modules, and these do not serve as limitations to the present disclosure.

Figure 7:
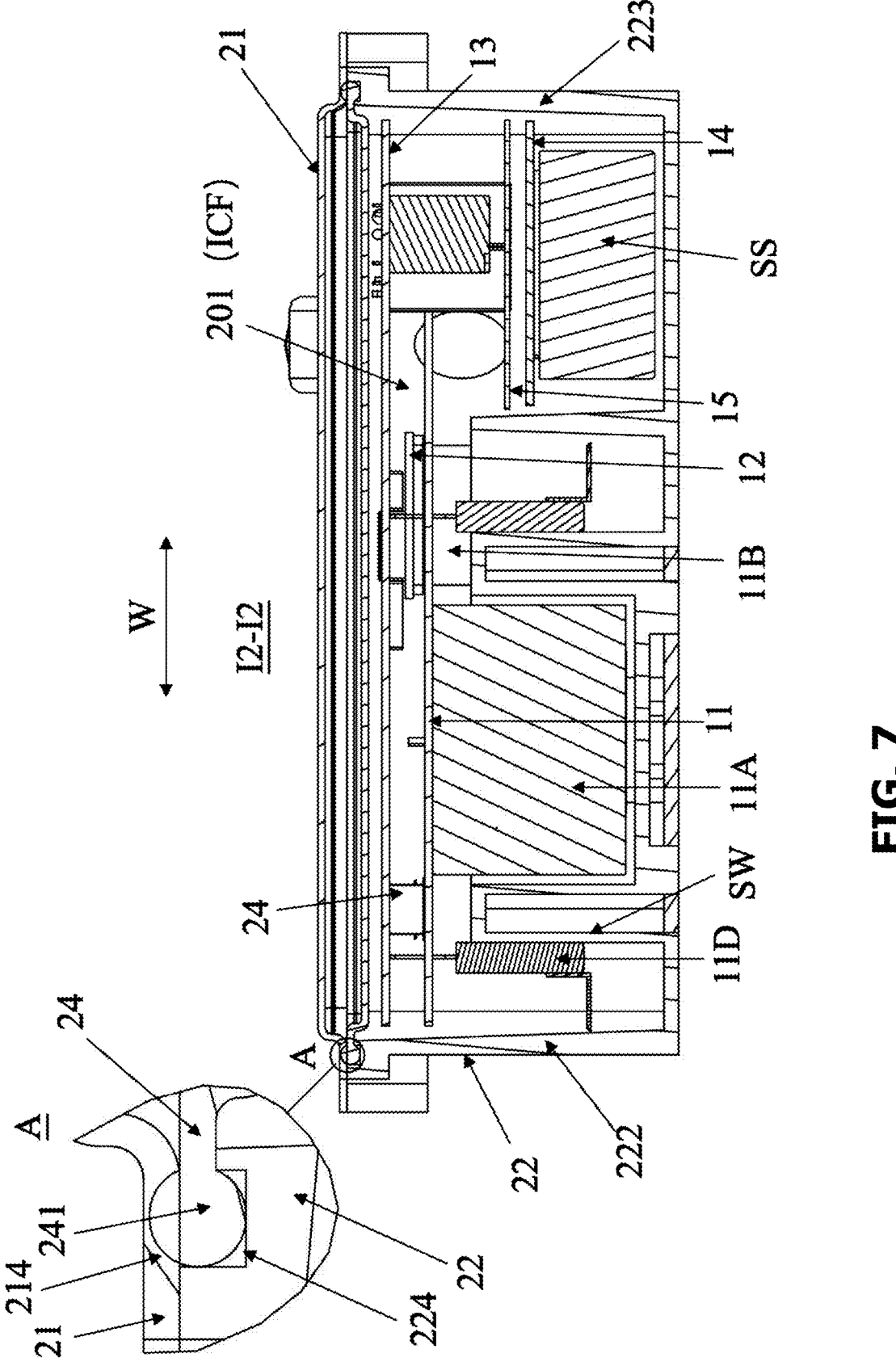
FIG. 7 is a schematic diagram of the structure of the onboard power device of FIG. 1 along section line I2-I2, wherein an enlarged structure of part A of the figure is also shown.

In some embodiments of the present disclosure, as shown in FIG. 2, in conjunction with reference to FIG. 6 to FIG. 7, shell 20 may include, for example, an inner cavity cover plate 21, a housing 22, and a passage cover plate 23. The inner cavity cover plate 21 may be assembled with housing 22 to form the inner cavity 201, for example, the inner cavity cover plate 21 may be detachably connected to housing 22 by detachable connection (for example, screw). The housing 22 may be assembled with the passage cover plate 23 to form the coolant passage (CP), for example, the passage cover plate 23 may be connected to the bottom 221 of housing 22 by stir friction welding to ensure a seal of the coolant passage. In one embodiment, the coolant passage (CP) may be formed, for example, at the bottom 221 of housing 22, as shown in FIG. 3; The inner cavity 201 may be formed above the coolant passage (CP), for example, as shown in FIG. 4. Of course, it will be appreciated that in other embodiments, the positions of the coolant passage (CP) and the inner cavity 201 may also be reversed, i.e., the coolant passage (CP) is above and the inner cavity 201 is below, which are not intended to limit the present disclosure.

In some embodiments of the present disclosure, the onboard power device 100 may further include an expandable air cushion 24 that may be mounted between the cavity cover plate 21 and the housing 22 and adjacent to the cavity cover plate 21. The expandable air cushion 24 can be used to adjust the volume change caused by the thermal expansion and contraction of the insulating heat conductive fluid. Specifically, when the temperature of the insulating heat conductive fluid inside the inner cavity 201 rises, the volume of the insulating heat conductive fluid becomes larger, which will compress the expandable air cushion 24, avoiding too much pressure inside the inner cavity 201; When the temperature of the insulating heat conductive fluid inside the inner cavity 201 drops, the volume of the insulating heat conductive fluid will become smaller and the expandable air cushion 24 will return to its original state. In one embodiment, as shown in the enlarged structure of part A in FIG. 7, the peripheral edge 241 of the expandable air cushion 24 can be mounted and sealed with an air cushion groove 224 correspondingly provided on the housing 22, and/or the peripheral edge 241 of the expandable air cushion 24 can also be mounted and sealed with an air cushion groove 214 correspondingly provided on the inner cavity cover plate 21. Further, the air cushion groove 224 and the air cushion groove 214 may be, for example, square groove or circular arc groove, which are not intended to limit the present disclosure.

In some embodiments of the present disclosure, as shown in FIG. 1, the onboard power device 100 may further include a liquid injection hole 29 that may be disposed at a side of shell 20 and communicated with the inner cavity 201 (in conjunction with reference to FIG. 6). A top surface of the liquid injection hole 29 is above a top surface of the inner cavity 201. The liquid injection hole 29 can be used to observe the liquid level of the insulating heat conductive fluid (ICF) in the inner cavity 201, as well as for replenishing and draining the liquid. In one embodiment, the liquid injection hole 29 may be sealed by a seal 291.

In some embodiments of the present disclosure, as shown in FIG. 1 and FIG. 3, the onboard power device 100 may further include a coolant inlet 27 and a coolant outlet 28 in communication with the coolant passage (CP). The coolant flows into the coolant passage (CP) through the coolant inlet 27 and flows out of the coolant passage (CP) through the coolant outlet 28. In one embodiment, the coolant inlet 27 and the coolant outlet 28 may be disposed on the same side of shell 20. In other embodiments, the coolant inlet 27 and a coolant outlet 28 may also be provided on opposite sides of shell 20, which is likewise not a limitation of the present disclosure.

As shown in FIG. 2, FIG. 4 to FIG. 7, the power assembly 10 may include, for example, an onboard charger module including, for example, a main circuit board 11, which may be fixed to the housing 22 by screw. The transformer 11A may be provided on the main circuit board 11, for example, as shown in FIG. 5. In one embodiment, as shown in FIG. 4, a portion of the coolant passage (CP) may extend toward the inner cavity 201 to form a transformer groove 22A in the inner cavity 201, and the transformer 11A on the main circuit board 11 may be correspondingly accommodated in the transformer groove 22A. Further, a first portion of the coolant passage (CP) may pass through the bottom of transformer 11A, and a second portion of the coolant passage (CP) may pass through the side of transformer 11A. After the assembly, transformer 11A can be potted in transformer groove 22A by the potting glue, and the outer wall of transformer groove 22A and an exposed portion of transformer 11A can be naturally cooled through the insulating heat conductive fluid. The transformer groove 22A is designed in such a way that transformer 11A can be cooled sufficiently and evenly.

In the present disclosure, the power switch 11D (including, for example, but not limited to, a MOS transistor) may also be disposed on the main circuit board 11, as shown in FIG. 5. As shown in FIG. 4, after assembly, the power switch 11D is correspondingly accommodated in the first space 22D of the inner cavity 201, and the power switch 11D, after assembly, is erectly fixed to the side wall SW of the coolant passage forming the transformer groove 22A and can be connected to the coolant passage (CP) through the heat conductive interface material. In one embodiment, the power switch 11D (for example, MOS transistor) can be erectly fixed to the side wall SW by means of a spring and screws and can be thermally connected to the coolant passage (CP) by an insulating heat conductive cap sleeve, thus forming a heat dissipation path with low thermal resistance, thereby ensuring heat dissipation of the power switch. At the same time, the power switch and transformer are disposed on both sides of the coolant passage, which can make full use of the space in the inner cavity and make the package of the onboard power unit more compact.

In the present disclosure, the main circuit board 11 may also be provided with other components, such as capacitors 11C and 11E, and power switches 11F (including, for example, but not limited to MOS transistor), as shown in FIG. 5. As shown in FIG. 4, after assembly, the capacitors 11C and 11E and the power switch 11F are accommodated correspondingly in the second space 22C, the third space 22E, and the fourth space 22F of the inner cavity 201. In addition, these capacitors 11C and 11E, and power switch 11F are also completely immersed in the insulating heat conductive fluid, so that sufficient and uniform cooling can be achieved in the insulating heat conductive fluid.

As shown in FIG. 2 and FIG. 4 to FIG. 7, in some embodiments of the present disclosure, the onboard charger module may also include a PFC circuit board 12, which may be screwed to housing 22, for example. The inductor 121 may be provided on the PFC circuit board 12. As shown in FIG. 4, a portion of housing 22 extends toward inner cavity 201, and an inductive groove 22B is formed in inner cavity 201. After assembly, inductor 121 on the PFC circuit board 12 is correspondingly accommodated in the inductive groove 22B. In one embodiment, inductor 121 may be potted in the inductive groove 22B, for example, through an potting glue, and the outer wall of the inductive groove 22B and the exposed portion of inductor 121 may be naturally cooled, for example, by insulating heat conductive fluid. This inductive groove 22B is designed in such a way that inductor 121 can be adequately and uniformly cooled.

As shown in FIG. 2, FIG. 4 to FIG. 7, in an embodiment of the present disclosure, the onboard charger module may further include a control circuit board 13, an EMI circuit board 14 and a shielding plate 15. Here, as shown in FIG. 7, the main circuit board 11 and the PFC circuit board 12 may be mounted under the control circuit board 13, for example, and the EMI circuit board 14 and the shielding plate 15 may be mounted under the control circuit board 13. The shielding plate 15 is disposed between the EMI circuit board 14 and the control circuit board 13 for shielding an electric field and a magnetic field. The EMI circuit board 14, the shielding plate 15, and the control circuit board 13 are stacked from bottom to top to form a stacked structure (SS), and in a width direction W of the housing 22, the main circuit board 11 is disposed adjacent to one side wall 222 of the housing 22, and the stacked structure (SS) is disposed adjacent to another side wall 223 of the housing 22. In the width direction W of housing 22, the PFC circuit board 12 is disposed between the main circuit board 11 and the stacked structure (SS). In one embodiment, the control circuit board 13 and the EMI circuit board 14 may be fixed to the housing 22 by screws, for example, and the shielding plate 15 may be fixed to the EMI circuit board 14 by screws, for example. The circuit arrangement can make full use of the inner cavity space, make the package compact, and further improve the power density of the onboard power device.

It shall be noted that, in other embodiments, the circuit configuration of the onboard charger module may be in other modes, and correspondingly, the structure of the housing is not limited thereto. For example, the main circuit board may be provided with a transformer and an inductor, and the inner cavity of the housing does not need to be specially provided with a heat dissipation groove for the transformer and inductor.

Figure 8:
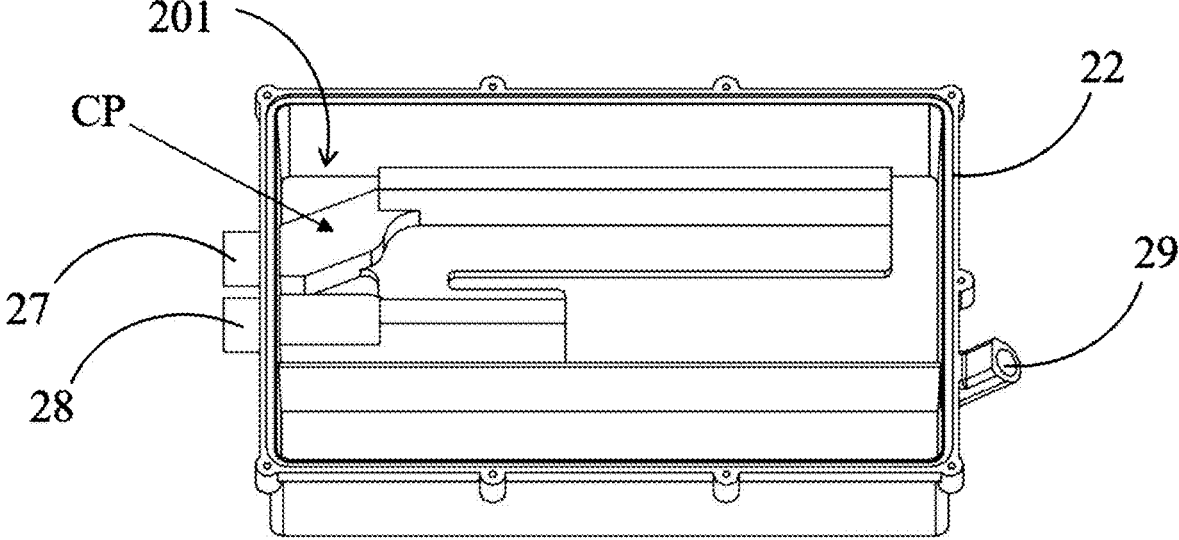
FIG. 8 is a schematic diagram of a deformed structure of the housing in FIG. 4.

As shown in FIG. 8, housing 22 of another structure is shown, in which the coolant passage (CP) extends toward the inner cavity 201, the power switch can be directly fixed erectly on the side wall of the coolant passage, the housing 22 is not provided with a transformer groove and an inductive groove, and the transformer on the main circuit board is directly immersed in the insulating heat conductive fluid without being potted in the transformer groove through an potting glue, and its heat is transferred to the coolant passage (CP) by the natural convection of the insulating heat conductive fluid, and then the heat is carried away by the coolant in the coolant passage (CP). Similarly, the inductor on the PFC circuit board does not need to be potted in the inductor groove through the potting glue. The inductor is directly immersed in the insulating heat conductive fluid, and its heat is transferred to the coolant passage (CP) through a natural convection of the insulating heat conductive fluid, and then the heat is carried away by the coolant in the coolant passage (CP).

Figure 9A:
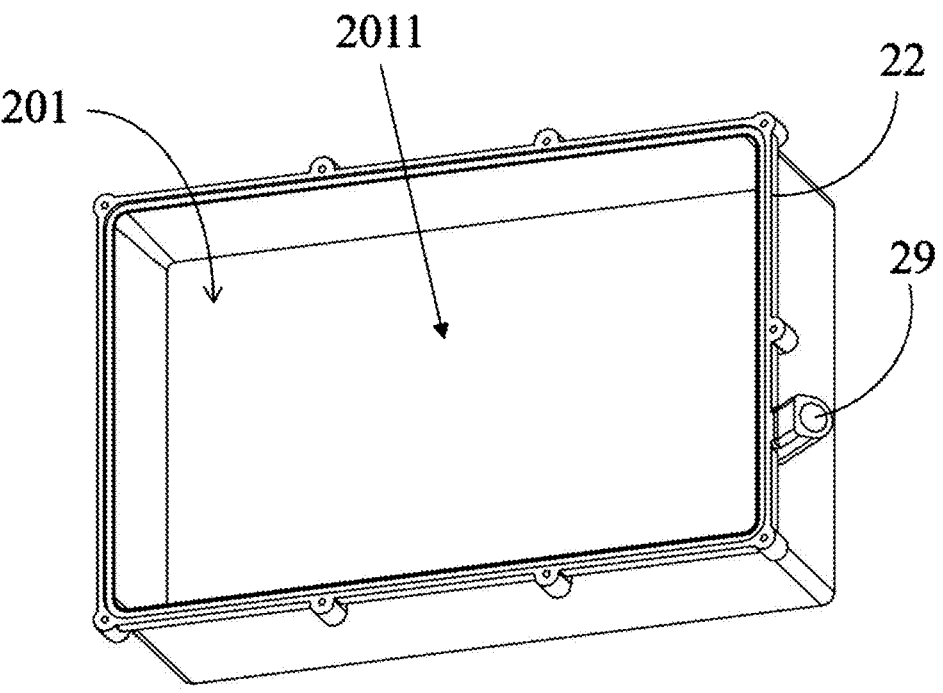
FIG. 9A is a schematic diagram of the structure of the housing of another embodiment of the present disclosure.
Figure 9B:
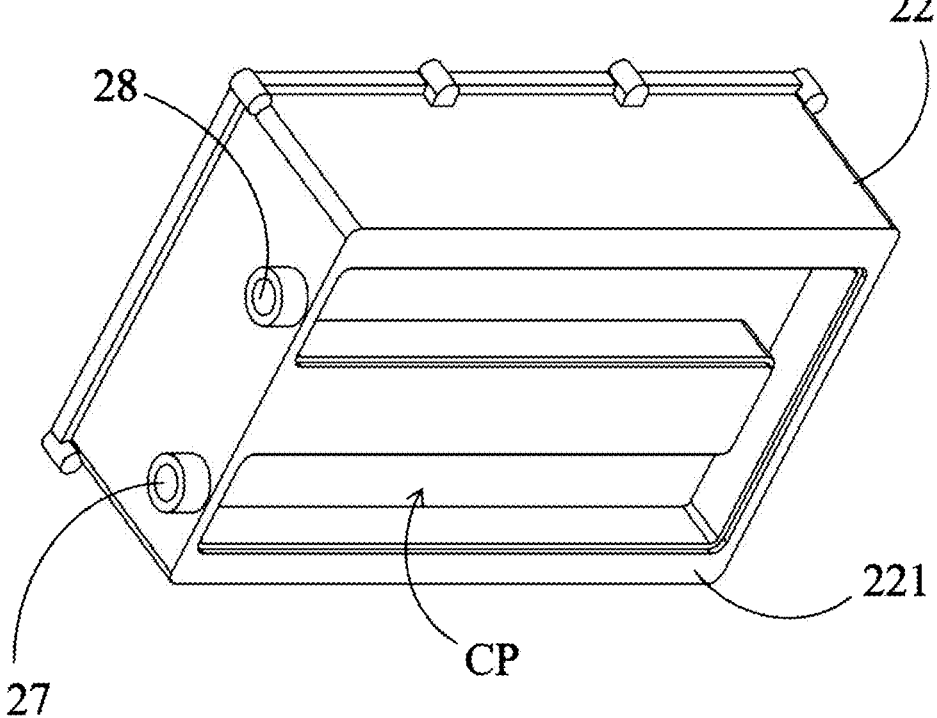
FIG. 9B is a schematic diagram of the structure of the housing of FIG. 9A from the bottom.
Figure 9C:
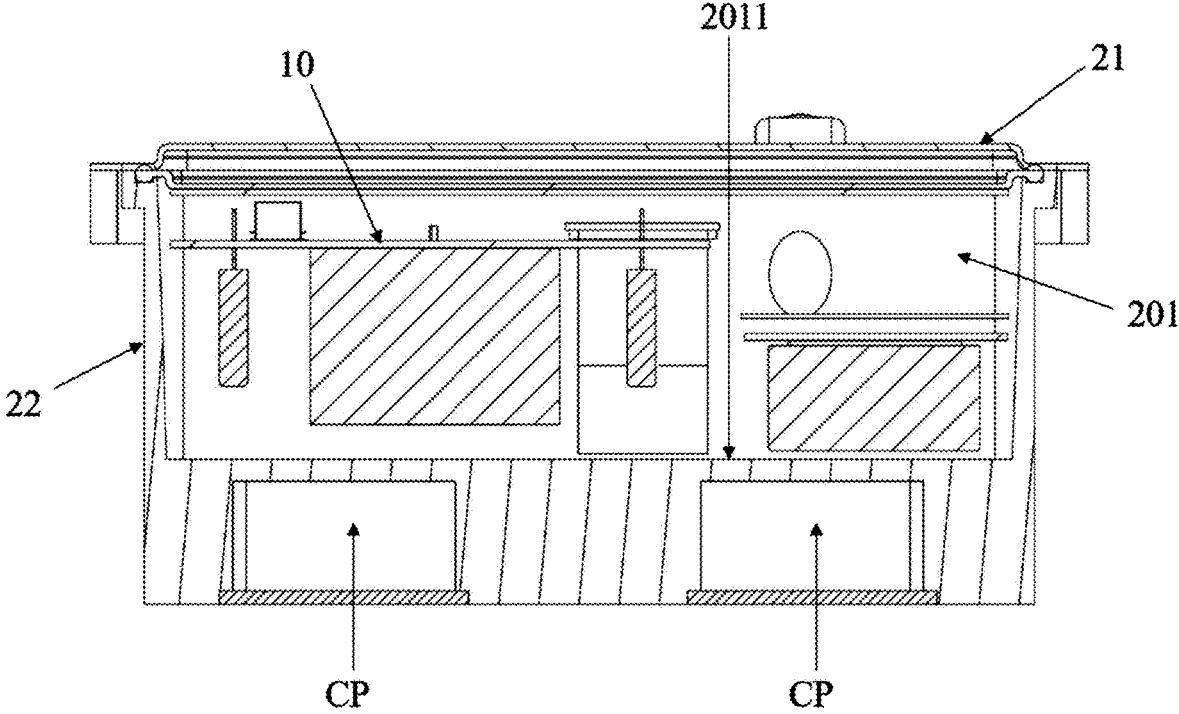
FIG. 9C is a schematic diagram of the section structure of the onboard power device assembled using the housing shown in FIG. 9A.

As shown in FIGS. 9A to 9C, another structural form of housing 22 is illustrated, which is not provided with a three-dimensional coolant passage with heat dissipation groove, etc., extending toward the inner cavity 201 (i.e., the bottom surface 2011 of the inner cavity 201 is flat with no inwardly extending structure), and the coolant passage (CP) is provided at the bottom 221 of the housing 22. The power assembly 10 (including but not limited to electronic components such as transformers, power switches, and inductors on the PFC circuit board) is directly immersed in the insulating heat conductive fluid and has no direct connection to the coolant passage (CP), all of which transfer heat to the coolant passage (CP) through a natural convection of the insulating heat conductive fluid, and then the heat is carried away through the coolant.

Figure 10A:
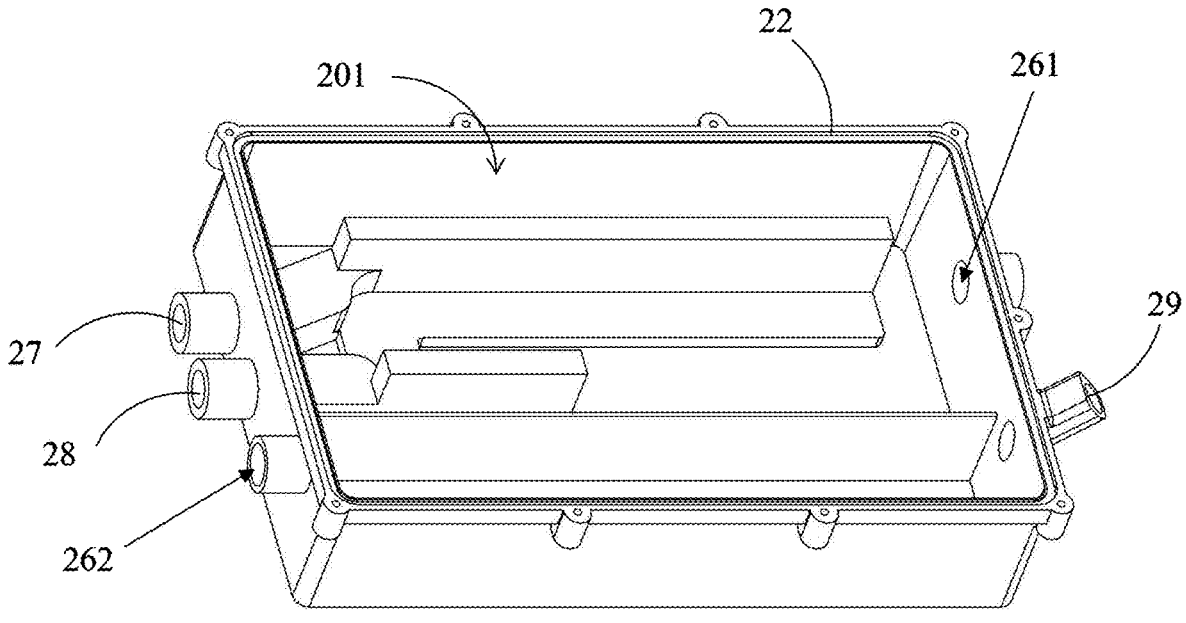
FIG. 10A is a schematic diagram of the structure of the housing of another embodiment of the present disclosure.
Figure 10B:
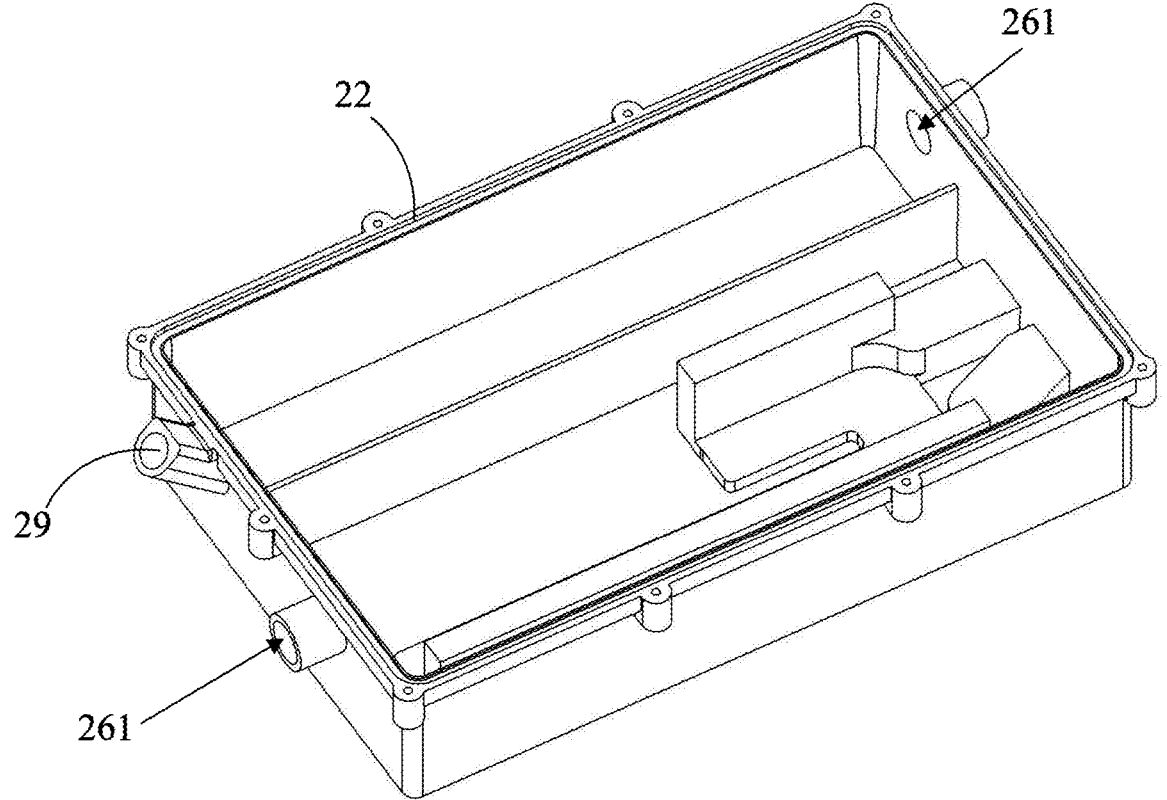
FIG. 10B is a schematic diagram of the structure of the housing in FIG. 10A viewed from another angle.

As shown in FIG. 10A to 10B, housing 22 of another structure is shown, wherein insulating heat conductive fluid inlet 261 and outlet 262 are provided, which are communicated with the inner cavity 201 and provided on opposite sides of housing 22. Housing 22 is not provided with a transformer groove and an inductive groove, and the transformer and the PFC inductor are directly immersed in the insulating heat conductive fluid and directly cooled by the forced convection of the circulating insulating heat conductive fluid. The power switch on the main circuit board is connected to the coolant passage through the interface material, and the other parts are immersed in the insulating heat conductive fluid for direct cooling through the forced convection of the circulating insulating thermal conductive liquid on the one hand, and indirect heat dissipation through the coolant passage on the other hand. Similarly, in some variant embodiments, the coolant passages can be eliminated and the power switch on the main circuit board is connected to the housing through the interface material for direct cooling by forced convection of the circulating insulating heat conductive fluid.

Figure 11A:
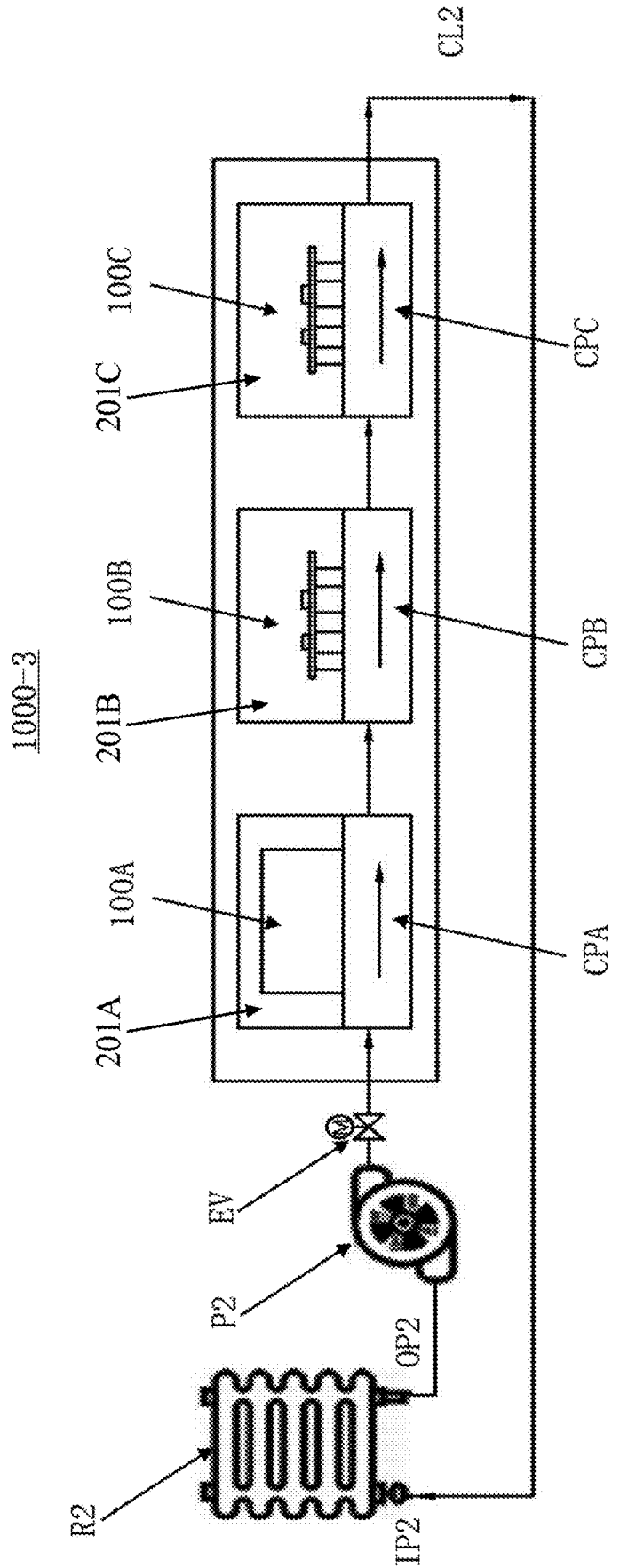
FIG. 11A is a schematic diagram of the composition of the thermal management system of the first embodiment of the present disclosure.
Figure 11B:
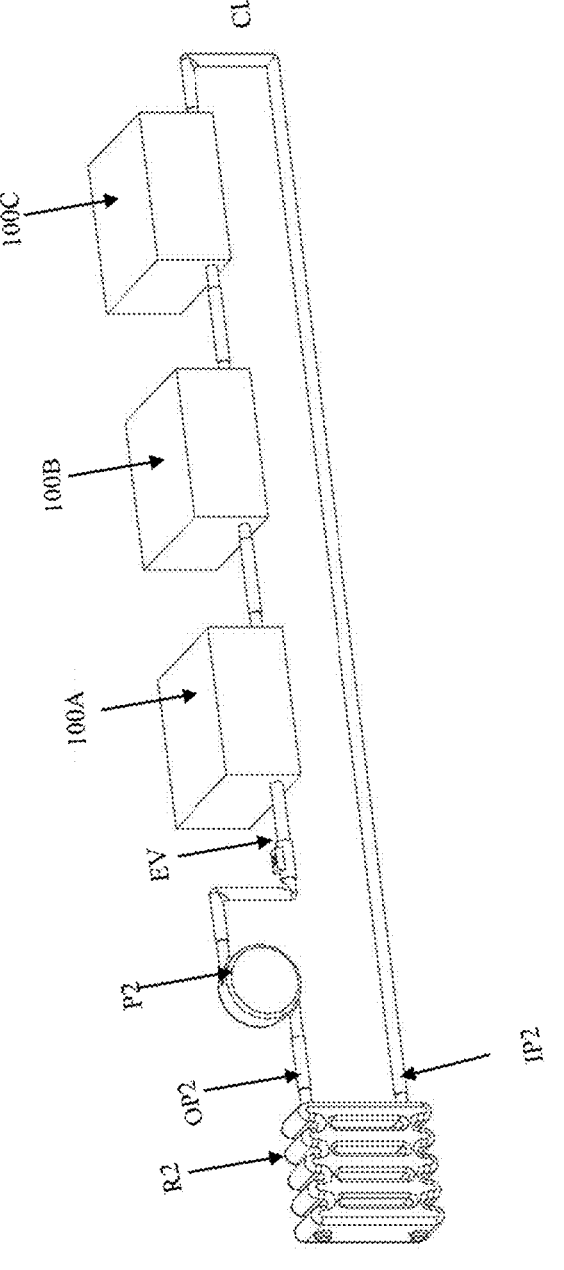
FIG. 11B is a schematic diagram of the three-dimensional structure of the thermal management system shown in FIG. 11A.

The present disclosure also provides a thermal management system that may include at least one onboard power device 100 as described in the various embodiments described above. As shown in FIG. 11A to FIG. 11B, the first thermal management system 1000-1 of the present disclosure may include, for example, three onboard power device 100A, 100B and 100C. Here the power assembly of the onboard power device 100A may include, for example, a battery module, which may be accommodated in the first metal cavity 201A. The power assembly of the onboard power device 100B may include, for example, an inverter module, which may be accommodated in the second metal cavity 201B. The power assembly of the onboard power device 100C may include, for example, an onboard charger (OBC) module, a DCDC power conversion module, or an integration of an OBC module and a DCDC power conversion, which may be accommodated in a third metal cavity 201C. The first metal cavity 201A, the second metal cavity 201B, and the third metal cavity 201C correspond to the inner cavity described in the above-described embodiment, and the first metal cavity 201A, the second metal cavity 201B, and the third metal cavity 201C are independent of each other and do not communicate with each other. In the embodiment shown in FIG. 11A to FIG. 11B, only three onboard power device are shown, and the three onboard power device 100A, 100B and 100C, for example, form an onboard electrical energy conversion system. However, it is understood that in other embodiments, the number of onboard power device including the thermal management system 1000-1 may also be other numbers and that these onboard power device may be one of the onboard charger (OBC) module, battery module, inverter module and DCDC power conversion module or a combination thereof, i.e., an onboard electrical energy conversion system including other different combinations of structures, again without being a limitation of the present disclosure.

In this embodiment, the inner cavity (i.e., the first metal cavities 201A, the second metal cavities 201B, and the third metal cavities 201C) of the onboard power device 100A, 100B, and 100C are independent of each other, and the power assembly of each onboard power device 100A, 100B, and 100C is immersed in the insulating heat conductive fluid in the inner cavity of each shell, so that the power assembly in each inner cavity can be directly cooled using the uncirculated insulating heat conductive fluid. At the same time, the coolant passages of the onboard power device 100A, 100B and 100C are connected to each other to form a cooling loop, and the coolant can circulate in the second cooling loop CL2 through the drive of the second pump P2, so that the circulating coolant can be used to indirectly cool the power assemblies in each inner cavity.

In some embodiments of the present disclosure, as shown in FIG. 11A to FIG. 11B, an solenoid valve EV may also be included in the second cooling loop CL2, which may be used to adjust a flow rate of the coolant circulating in the second cooling loop CL2.

In some embodiments of the present disclosure, as shown in FIG. 11A to FIG. 11B, the thermal management system 1000-1 may further include a second cooler R2 in communication with the second cooling loop CL2. Further, the second cooler R2 is connected to the second cooling loop CL2 through the second input port IP2 and the second output port OP2, and the second cooler R2 is used to cool the coolant flowing from the second cooling loop CL2 and return the cooled coolant to the second cooling loop CL2. In this embodiment, the second pump P2 drives the coolant to circulate in the second cooling loop CL2, thereby achieving indirect forced convective cooling of the power assemblies.

Figure 12:
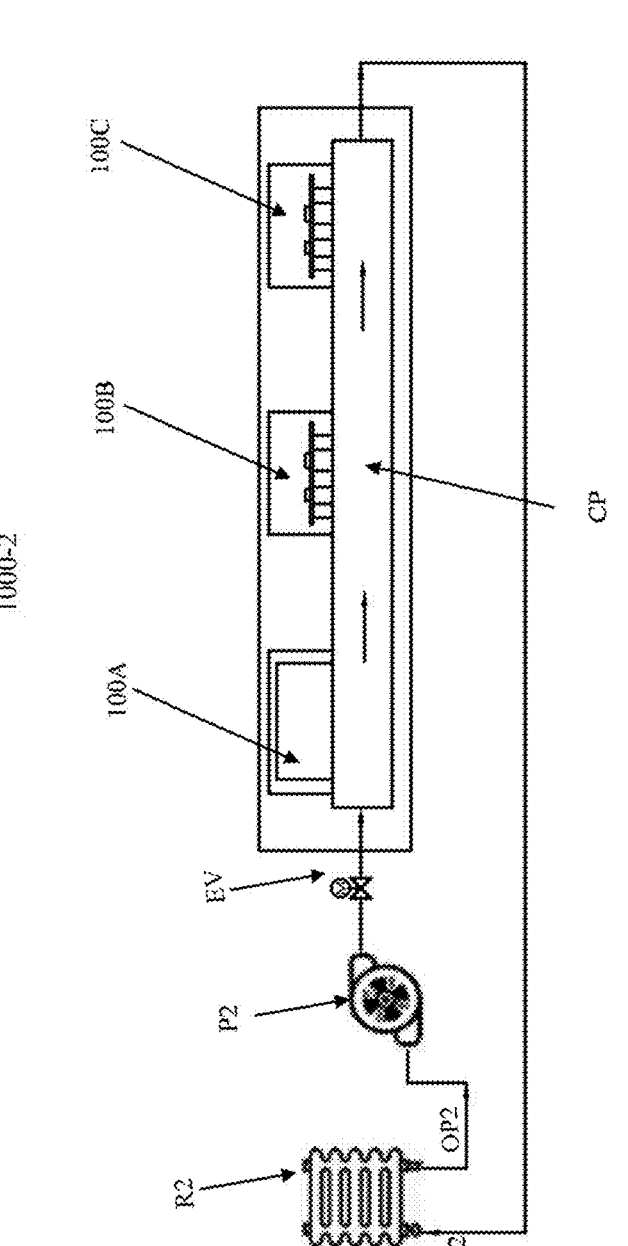
FIG. 12 is a schematic diagram of the composition of the thermal management system of the second embodiment of the present disclosure.

In some embodiments of the present disclosure, as shown in FIG. 12, the coolant passages of the respective onboard power device 100A, 100B and 100C in the thermal management system 1000-2 may, for example, share one coolant passage (CP), for example, only one cooling plate is used to form the coolant passage (CP).

Figure 13:
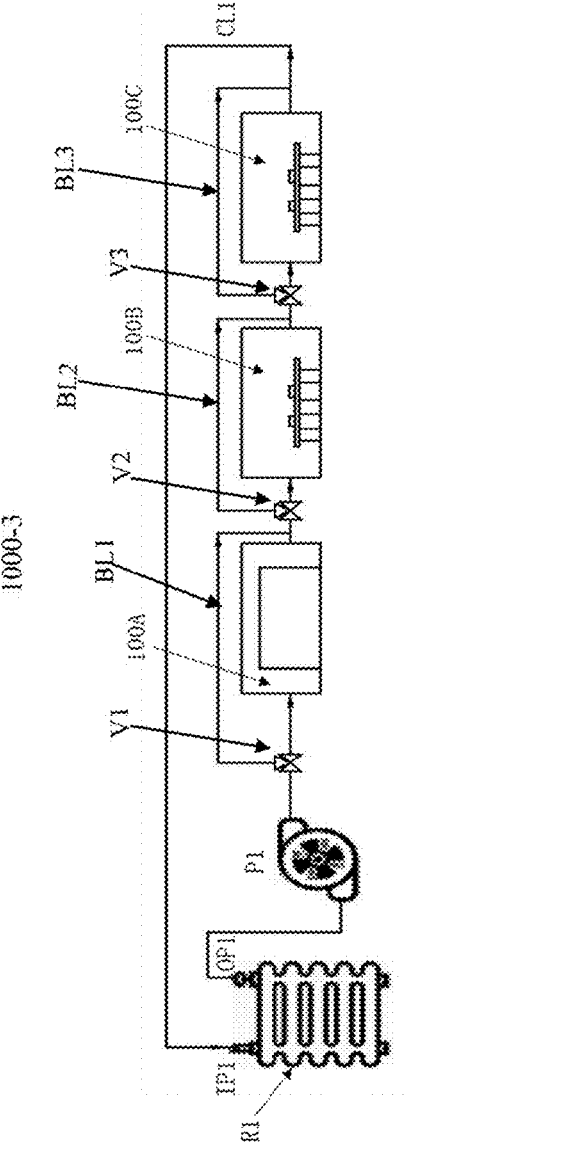
FIG. 13 is a schematic diagram of the composition of the thermal management system of the third embodiment of the present disclosure.

In some embodiments of the present disclosure, as shown in FIG. 13, a second cooling loop may not be provided in the thermal management system 1000-3, and each of the inner cavity (i.e., the first metal cavity 201A, the second metal cavity 201B, and the third metal cavity 201C) of each onboard power device 100A, 100B and 100C is provided with insulating heat conductive fluid inlet and an insulating heat conductive fluid outlet, respectively, communicated with the inner cavity. The insulating heat conductive fluid flows into the inner cavity from the inlet and flows out from the outlet to form a first cooling loop CL1. The insulating heat conductive fluid can flow through the first cooling loop CL1 through the drive of the first pump P1, so that the power assembly in each inner cavity can be directly cooled by the flowing insulating heat conductive fluid.

In some embodiments of the present disclosure, as shown in FIG. 13, in the first cooling loop CL1, each of the onboard power devices 100A, 100B and 100C is also further connected to one of the flow branches BL1, BL2 and BL3 in parallel, respectively. The heat conductive fluid inlet of each onboard power unit 100A, 100B and 100C is connected to the corresponding flow branch lines BL1, BL2 and BL3 through controllable branching valves V1, V2 and V3. These controllable branching valves V1, V2 and V3 can be used to adjust a flow rate of the insulating heat conductive fluid flowing through the inner cavity of each of the onboard power devices according to a load condition of each onboard power device; The valves V1, V2 and V3 can also be completely closed when the circulation of the insulating heat conductive fluid is not required.

In some embodiments of the present disclosure, the thermal management system 1000-3 may further include a first cooler R1 connected to the first cooling loop CL1, as shown in FIG. 13. The first cooler communicates with the first cooling loop CL1 through the first input port IP1 and the first output port OP1, and the first cooler R1 cools the insulating heat conductive fluid flowing out of the first cooling loop CL1 and returns the cooled insulating heat conductive fluid to the first cooling loop CL1. In this embodiment, the first pump P1 drives the insulating heat conductive fluid to flow through the first cooling loop CL1, thereby achieving direct forced convective cooling of the power assembly.

Figure 14:
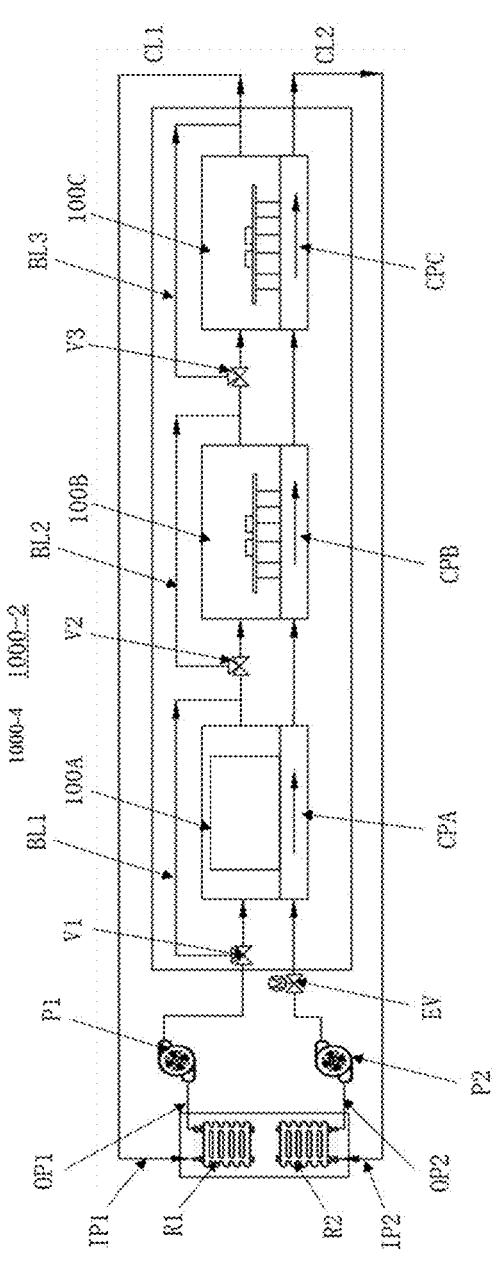
FIG. 14 is a schematic diagram of the composition of the thermal management system of the forth embodiment of the present disclosure.

In some embodiments of the present disclosure, as shown in FIG. 14, a first cooling loop CL1 and a second cooling loop CL2 may be provided simultaneously in the thermal management system 1000-4, wherein the power assembly in each inner cavity is directly cooled using the circulating insulating heat conductive fluid in the first cooling loop CL1, while the power assembly in each inner cavity is indirectly cooled using the circulating cooling liquid in the second cooling loop CL2.

In the embodiment shown in FIG. 11A to FIG. 14, a plurality of onboard power devices are connected in series to form a thermal management system. However, in other embodiments, the thermal management system may also consist of a plurality of onboard power devices connected in parallel. Moreover, it can be understood that the series/parallel sequence of the plurality of onboard power device constituting the thermal management system is not limited; Also, the pump may be a single structure or an integrated structure (i.e., having a plurality of input ports and output ports), which is likewise not limiting the present disclosure.

The present disclosure allows the power assembly to be cooled sufficiently and uniformly by immersing the power assembly in insulating heat conductive fluid. In addition, the insulation clearance and creepage on the PCB in the power module can be appropriately reduced due to the strong insulation ability of the insulating heat conductive fluid.

The present disclosure can observe the liquid level of the insulating heat conductive fluid in the inner cavity by providing a liquid injection hole on the shell, which can facilitate liquid replenishment and drainage. The present disclosure is also used to regulate the thermal expansion and contraction of the insulating heat conductive fluid due to temperature changes by providing an expandable air cushion.

In the present disclosure, the onboard power device is cooled by the combination of "immersion heat dissipation" of the power assembly immersed in the insulating heat conductive fluid and "liquid cooling heat dissipation" of the coolant flowing through the coolant passage. During the operation, the insulating heat conductive fluid has no phase change, and the power assembly immersed therein can be directly contacted and cooled by the natural convection of the insulating heat conductive fluid. At the same time, the power assemblies are indirectly cooled by the coolant passage formed on the channel cover plate, for example, so that the heat dissipation effect can be further improved. The overall power density can also be further improved and enhanced for thermal management systems with onboard power device of the present disclosure, for example, an onboard electrical energy conversion system.

Exemplary embodiments of the present disclosure have been specifically shown and described above. It should be understood that the present disclosure is not limited to the disclosed embodiments. On the contrary, the present disclosure is intended to cover various modifications and equivalent arrangements included in the spirit and scope of the appended claims.

What is claimed is:

1. An onboard power device, comprising:
   a power assembly comprising a plurality of electronic components;
   a shell comprising an inner cavity and a coolant passage that are isolated from each other, wherein the power assembly is disposed in the inner cavity which is filled with insulating heat conductive fluid, the power assembly is immersed in the insulating heat conductive fluid, and a coolant flows through the coolant passage; and
   an expandable air cushion,
   wherein the shell comprises an inner cavity cover plate and a housing, and
   wherein the expandable air cushion is mounted between the inner cavity cover plate and the housing and adjacent to the inner cavity cover plate, enabling to adjust a volume change caused by thermal expansion and contraction of the insulating heat conductive fluid.

2. The onboard power device according to claim 1, wherein
   the shell comprises passage cover plate, wherein the inner cavity cover plate is assembled with the housing to form the inner cavity, and the housing is assembled with the passage cover plate to form the coolant passage, and the coolant passage is formed in a bottom of the housing, and the inner cavity is formed above the coolant passage.

3. The onboard power device according to claim 2, wherein the passage cover plate is connected to the bottom of the housing via a friction stir welding (FSW); and/or, the inner cavity cover plate is detachably connected to the housing via a detachable connector.

4. The onboard power device according to claim 2, wherein a circumferential edge of the expandable air cushion is fitted to and sealed with an air cushion groove provided correspondingly on at least one of the housing and the inner cavity cover plate.

5. The onboard power device according to claim 1, further comprising:

a liquid injection hole disposed at a side of the shell and communicated with the inner cavity, wherein a top surface of the liquid injection hole is higher than a top surface of the inner cavity.

6. The onboard power device according to claim 1, further comprising at least one of:

a coolant inlet and a coolant outlet that are communicated with the coolant passage, wherein the coolant inlet and the coolant outlet are provided on the same side or on the opposite sides of the shell; and, a heat conductive fluid inlet and a heat conductive fluid outlet that are communicated with the inner cavity, wherein the heat conductive fluid inlet and the heat conductive fluid outlet are disposed on opposite sides of the shell.

7. The onboard power device according to claim 2, wherein the power assembly comprises an onboard charger module which comprises a main circuit board on which a transformer is provided, and wherein a portion of the coolant passage extends toward the inner cavity to form a transformer groove in the inner cavity, the transformer on the main circuit board being disposed in the transformer groove, a first portion of the coolant passage passing through a bottom of the transformer, and a second portion of the coolant passage passing through a side of the transformer.

8. The onboard power device according to claim 7, wherein a power switch is further provided on the main circuit board, wherein the onboard charger module further comprises a PFC circuit board on which an inductor is provided, wherein the power switch is erectly fixed on a side wall of the coolant passage and connected to the coolant passage through a heat conductive interface material, and wherein a portion of the housing extends toward the inner cavity to form an inductive groove in the inner cavity, the inductor on the PFC circuit board is disposed in the inductive groove.

9. The onboard power device according to claim 8, wherein the transformer is encapsulated in the transformer groove through a potting glue and the outer wall of the transformer groove and an exposed portion of the transformer are naturally cooled through the insulating heat conductive fluid; and/or, the inductor is encapsulated in the inductive groove through the potting glue, and the outer wall of the inductive groove and an exposed portion of the inductor are naturally cooled through the insulating heat conductive fluid.

10. The onboard power device according to claim 8, wherein the onboard charger module further comprises a control circuit board, an EMI circuit board and a shielding plate, and the main circuit board and the PFC circuit board are mounted under the control circuit board;

the EMI circuit board and the shielding plate are mounted under the control circuit board, and the shielding plate is disposed between the EMI circuit board and the control circuit board;

the EMI circuit board, the shielding plate, and the control circuit board are stacked from bottom to top to form a stacked structure, and in a width direction of the shell, the main circuit board is disposed adjacent to one side wall of the housing, the stacked structure is disposed adjacent to another side wall of the housing, and the PFC circuit board is disposed between the main circuit board and the stacked structure.

11. The onboard power device according to claim 1, wherein the insulating heat conductive fluid is oil or a fluorinated liquid, and the coolant is an ethylene glycol solution; and the inner cavity is filled with the insulating heat conductive fluid, and the power assembly is completely immersed in the insulating heat conductive fluid.

12. The onboard power device according to claim 1, wherein the power assembly comprises at least one of an onboard charger module, a battery module, an inverter module, and a DCDC power conversion module.

13. A thermal management system, comprising:

a plurality of onboard power devices according to claim 1;

the inner cavity of each of the plurality of onboard power devices is communicated with each other to form a first cooling loop, and the insulating heat conductive fluid flows through the first cooling loop via a driving of a first pump; and/or, the coolant passage of each of the plurality of onboard power device is communicated with each other to form a second cooling loop, and the coolant flows through the second cooling loop via a driving of a second pump.

14. The thermal management system according to claim 13, wherein in the first cooling loop, each of the plurality of onboard power devices is connected to a flow branch in parallel, and the heat conductive fluid inlet of each of the plurality of onboard power devices is connected to a corresponding flow branch through a controllable branching valve which is used for adjusting a flow rate of the insulating heat conductive fluid flowing through the inner cavity of each of the plurality of onboard power devices according to a load condition of each of the plurality of onboard power devices.

15. The thermal management system according to claim 13, further comprising at least one of:

a first cooler communicated with the first cooling loop; and,

a second cooler communicated with the second cooling loop;

wherein in a case where the thermal management system comprises both the first cooler and the second cooler, the first cooler and the second cooler are separated individual coolers; or, the first cooler and the second cooler are integrated together.

16. The thermal management system according to claim 13, wherein a plurality of the onboard power devices are provided, wherein the power assembly of each of the plurality of onboard power devices comprises at least one of a battery module, an inverter module, an onboard charger module, and a DCDC power conversion module.

17. The onboard power device according to claim 2, wherein the power assembly comprises an onboard charger module which comprises a main circuit board on which a transformer is provided, wherein a bottom surface of the inner cavity is planar, and wherein the transformer is directly immersed in the insulating heat conductive fluid, so that a direct contact cooling is performed through a natural convection of the insulating heat conductive fluid.

18. The onboard power device according to claim 17, wherein a power switch is further provided on the main circuit board, wherein the onboard charger module further comprises a PFC circuit board on which an inductor is provided, wherein the power switch is directly immersed in the insulating heat conductive fluid, so that the direct contact cooling is performed through a natural convection of the insulating heat conductive fluid, and wherein the inductor on the PFC circuit board is directly immersed in the insulating heat conductive fluid, so that a direct contact cooling is performed through a natural convection of the insulating heat conductive fluid.

19. The thermal management system according to claim 13, wherein the second cooling loop further comprises a solenoid valve for adjusting a flow rate of the coolant flowing through the second cooling loop.

20. A thermal management system, comprising:

a plurality of onboard power devices, each of which comprises a power assembly comprising a plurality of electronic components, and a shell comprising an inner cavity and a coolant passage that are isolated from each other, wherein the power assembly is disposed in the inner cavity which is filled with insulating heat conductive fluid, and the power assembly is immersed in the insulating heat conductive fluid, wherein a power assembly of each of the plurality of onboard power devices comprises at least one of a battery module, an inverter module, an onboard charger module, and a DCDC power conversion module, and wherein the inner cavity of each of the plurality of onboard power devices is in fluid communication with the inner cavity of other onboard power devices to form a first cooling loop, and the insulating heat conductive fluid flows through the first cooling loop via a driving of a first pump, wherein the power assembly comprises an onboard charger module which comprises a main circuit board on which a transformer is provided, wherein a portion of the coolant passage extends toward the inner cavity, or a bottom surface of the inner cavity is planar, and wherein a portion of the coolant passage extends toward the inner cavity to form a transformer groove in the inner cavity, the transformer on the main circuit board being disposed in the transformer groove, a first portion of the coolant passage passing through a bottom of the transformer, and a second portion of the coolant passage passing through a side of the transformer; or, the transformer being directly immersed in the insulating heat conductive fluid, so that a direct contact cooling is performed through a natural convection of the insulating heat conductive fluid.

* * * * *